United States Patent [19]
Chan et al.

[11] Patent Number: 5,912,503
[45] Date of Patent: *Jun. 15, 1999

[54] PLANAR IN-LINE RESISTORS FOR SUPERCONDUCTOR CIRCUITS

[75] Inventors: Hugo W. Chan; Arnold H. Silver, both of Rancho Palos Verdes, Calif.

[73] Assignee: TRW Inc., Redondo Beach, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/785,031

[22] Filed: Jan. 2, 1997

[51] Int. Cl.$^6$ .......................... H01L 39/00; H01B 12/00; B32B 12/00
[52] U.S. Cl. .......................... 257/663; 257/661; 338/325; 338/308; 338/320; 505/191; 505/231; 505/237
[58] Field of Search .......................... 338/325, 309, 338/320; 257/661, 662, 663; 505/191, 220, 231, 237, 413, 431, 704, 706, 856, 866

[56] References Cited

U.S. PATENT DOCUMENTS

| | | | |
|---|---|---|---|
| 5,140,001 | 8/1992 | Allen et al. | 257/661 |
| 5,229,360 | 7/1993 | Shiga et al. | 257/663 |

FOREIGN PATENT DOCUMENTS

| | | | |
|---|---|---|---|
| 1-181444 | 7/1989 | Japan | 257/663 |
| 5-315660 | 11/1993 | Japan | 257/661 |
| WO 94/27329 | 11/1994 | WIPO | 257/661 |

*Primary Examiner*—Mahshid Saadat
*Assistant Examiner*—Allan R. Wilson
*Attorney, Agent, or Firm*—Michael S. Yatsko

[57] ABSTRACT

A method of fabricating a low-inductance, in-line resistor includes the steps of: depositing a superconductive layer 12 on a base layer 14; patterning an interconnect region 16 on the superconductive layer 12; and converting the interconnect region 16 of the superconductive layer 12 to a resistor material region 18. The resistor region 18 and the superconductive layer 12 are substantially in the same plane. The method can further include the steps of depositing a conductive layer 22 on the resistor region 18 and on the photo-resist layer 20, and lifting off the photo-resist layer 20 to leave the conductive layer 22 on the resistor region 18. As such, the conductive layer 22 provides a low sheet resistivity for the resistor region 18. In another embodiment, the method includes the steps of: depositing in-situ a superconductive layer 12 on a base layer 14; depositing in-situ a conductive layer 22 on the superconductive layer 12 to form a bi-layer 24; patterning an interconnect region 16 on the bi-layer 24; and converting the interconnect region 16 of the bi-layer 24 to a resistor material region 18.

11 Claims, 6 Drawing Sheets

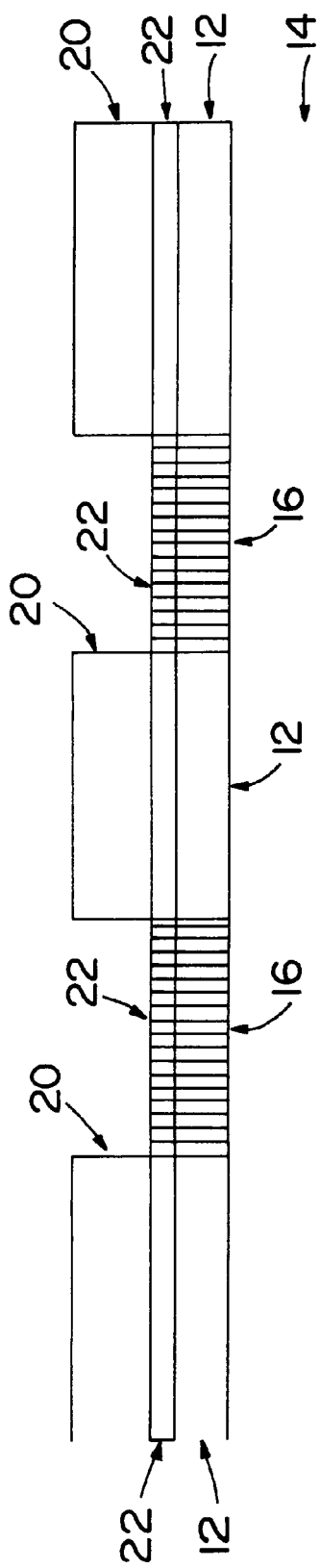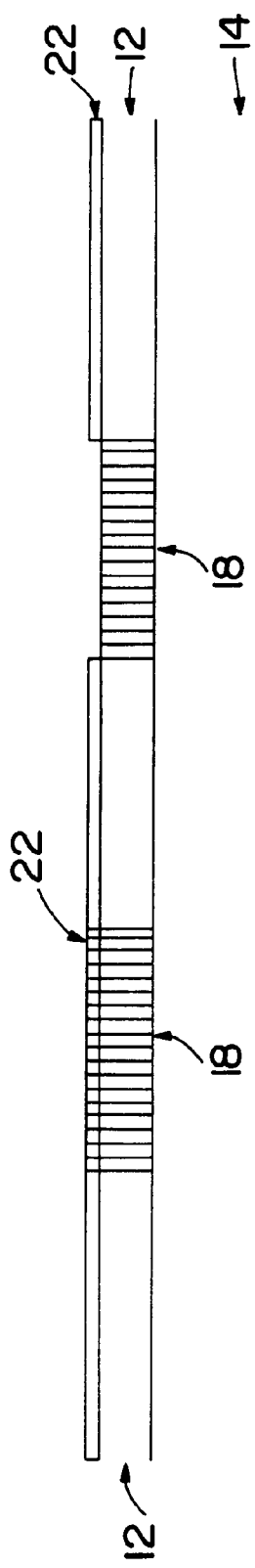

PLANAR IN-LINE RESISTORS FOR SUPERCONDUCTOR CIRCUITS

BACKGROUND

The present invention generally relates to superconductor circuits and, in particular, to low-inductance resistors for superconductor circuits.

With increasing demand for speed and efficiency in digital circuits, superconductor circuits have found significant application in defense and commercial systems including high-speed super-computers, digital processors, high-performance network switches, analog to digital converters, rf filters, resonators, low-loss transmission lines, mine-detectors and bio-magnetic imagers. The resistor is a most essential component of any superconductor integrated circuit.

A vital component of any superconductor circuit is a resistor. Resistors are utilized as terminating resistors for high-speed transmission lines, bias-current resistors, damping/shunt and/or load line resistors for Josephson Junctions and SQUID (Superconductive Quantum Interference Device) circuits. Depending on the application, resistor values can be as low as one milliohm to as high as 10–100 ohms. With such variance in resistor values, it is necessary to fabricate resistors with different sheet resistivities having low and high values where sheet resistivity is determined by $Rs=\rho/T$ where $\rho$ is resistivity of the film and T is the thickness expressed in ohms/square of the film. It becomes necessary to use different layout geometries to customize a desired sheet resistance value.

Conventional resistor modules are typically fabricated by: depositing a thin film of resistive material on a substrate; patterning the resistive material to define a resistor structure; depositing a dielectric layer on the resistive film; patterning via contacts to the resistor; depositing a superconductive interconnect layer on the dielectric layer; and patterning a superconductive interconnect layer.

A schematic of a resistor structure fabricated using conventional methods is shown in FIG. 1. The first processing step is to deposit a thin film of resistive material R on a substrate U and to pattern R to define the resistor structure. Overlaying R is next applied a dielectric layer DL. Via contacts are patterned to R and a film of HTS interconnect is grown over the DL. The HTS is patterned. This process results in a non-planar topology. Non-planarity, as schematically represented in FIG. 1, creates grain boundary "GB" zones and etching irregularities e.g., over etching, involving the boundary between HTS and R. The GB zones cause electrical discontinuities and the etching irregularities result in high interface resistance or discontinuities.

A disadvantage of the conventional fabrication methods is the process complexity due to the number of steps involved. Another problem is the potentially high interface contact resistance from the superconductive interconnect layer to the resistor layer. Yet, a further problem is that of potential over-etching associated with etching the vias in dielectric layer over the very thin resistor film material.

A disadvantage of fabricating resistors for superconductor circuits using conventional methods is that they involved non-planar topologies for the superconductive interconnect layers. A non-planar topology on which is grown a superconductive film encounters ramp discontinuities which can cause open or high resistance connection of the superconductive interconnect layer. It is the ramp boundaries that reduce the super current it can carry and this results in an electrical discontinuity. This problem is particularly severe for niobium nitride and high-temperature superconductors such as copper oxide superconductors. Another disadvantage of such resistors is high parasitic inductance of the resistor structure because of non-planar and complicated topology.

There is, therefore, a need for a process of fabricating a low-inductance resistor with substantially planar topology. There is also a need for a such a process to have fewer steps which are less complex.

SUMMARY

The present invention satisfies these needs. The present invention provides a method of fabricating a low-inductance, in-line resistor. The method comprises the steps of: depositing a superconductive layer on a suitable substrate or base layer; patterning an interconnect region on the superconductive layer; and converting the interconnect region of the superconductive layer to a resistor material region. The resistor region and the superconductive layer are substantially in the same plane. As such, the resistor structure is substantially planar in topology.

Patterning can include masking the superconductive layer with a photo-resist layer to pattern the interconnect region. The photo-resist layer can then be removed. There are different techniques which can be effectively used for the step of converting the interconnect region to a resistor material region, such as ion implanting, electron beam or focused ion beam treatment. In the following discussion it will be understood that the patterned HTS layer can be selectively converted to produce a resistor region that has a different configuration than the etched pattern. In other words the converted region using the different conversion techniques need not coincide with the etched HTS pattern. The process of ion-implantation requires annealing the region to activate the implanted ions. The step of converting the interconnect region to a resistor material region can be accomplished by the aforementioned irradiation techniques as well as using doped diffusion techniques. Irradiation techniques include ion implantation, electron beam radiation and ion-beam radiation. Doped diffusion techniques involve permitting the dopant to react with the interconnect region by temperature driving to diffuse the dopant.

The method of the present invention can further include the steps of depositing a conductive layer on the resistor region and on the photo-resist layer, and lifting off the photo-resist layer to leave the conductive layer on the resistor region. As such, the conductive layer provides a low sheet resistivity for the resistor region. The conductive layer can be a metallic layer.

In another embodiment, a method of fabricating a low-inductance, in-line resistor according to the present invention includes the steps of: depositing in-situ a superconductive layer on a suitable substrate or base layer; depositing in-situ a conductive layer on the superconductive layer to form a bi-layer; patterning an interconnect region on the bi-layer; and converting the interconnect region of the bi-layer to a resistor material region. Advantageously, the resistor region and the bi-layer are substantially in the same plane.

Patterning can include masking the bi-layer with a photo-resist layer to pattern the interconnect region. The photo-resist layer is then removed. The step of converting can include ion-implanting the interconnect region to convert the interconnect region to a resistor material region.

In another aspect, the present invention provides low-inductance, in-line resistors fabricated according to the above processes.

DRAWINGS

These and other features, aspects and advantages of the present invention will become understood with reference to the following description, appended claims and accompanying drawings where:

FIGS. 10–11 illustrate an example of both high value and low value resistors on one layer fabricated according to the methods of FIG. 7.

DESCRIPTION

Figure 2:
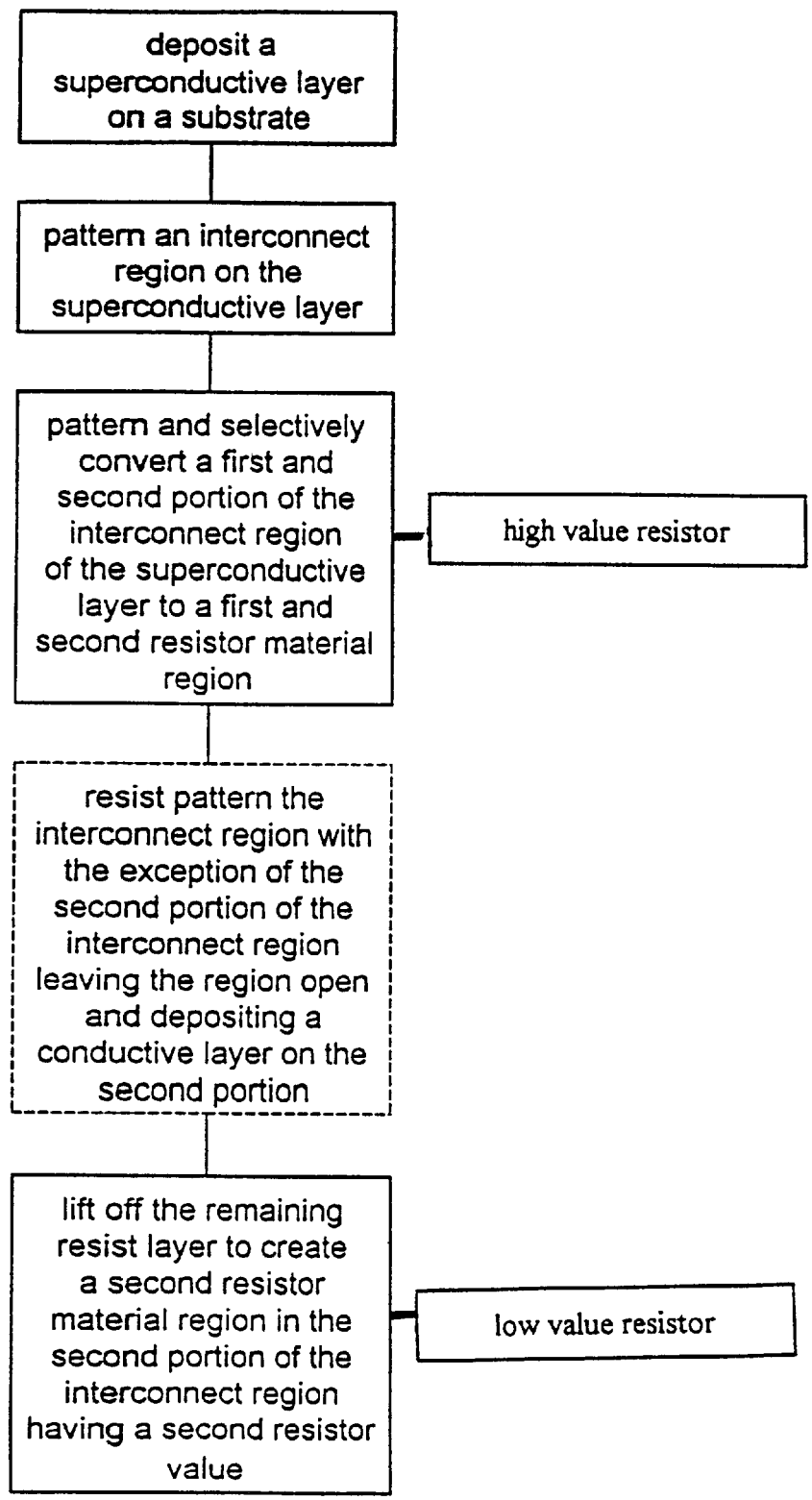
FIG. 2 illustrates the steps of an embodiment of a method of fabricating a low-inductance in-line resistor according to the present invention to produce both high and low value in line resistors.
Figure 3:
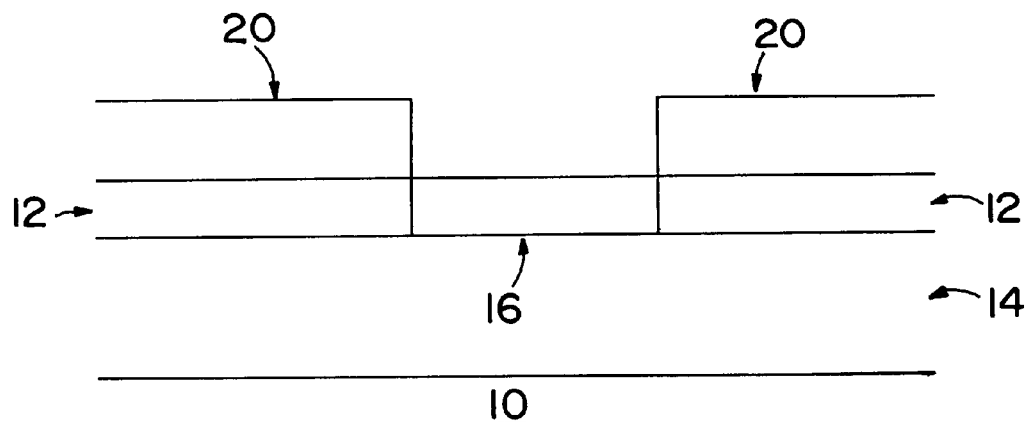
FIGS. 3–4 illustrate high value resistors fabricated according to the method of FIG. 2.
Figure 4:
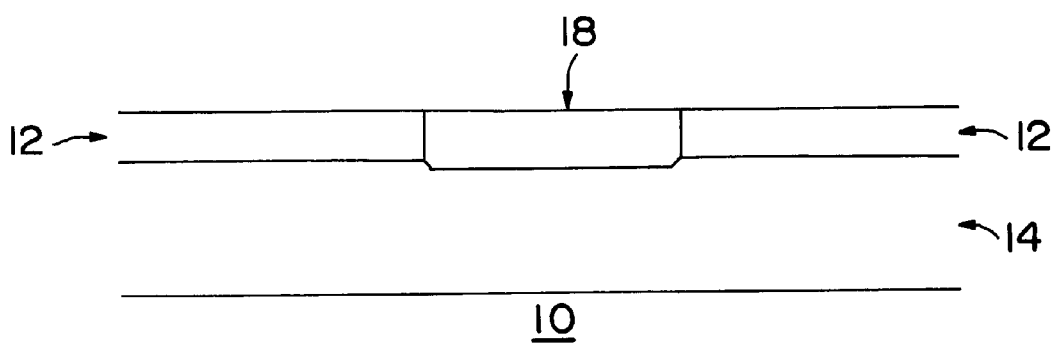

Referring to FIG. 2, there is shown a block diagram and in FIGS. 3–4 a simplified sketch of the structure depicting a method of fabricating a low-inductance in-line resistor 10 according to the present invention. The method of the present invention includes the steps of: depositing a superconductive layer 12 on a base layer 14; patterning an interconnect region 16 on the superconductive layer 12; and converting the interconnect region 16 of the superconductive layer 12 to a resistor material region 18 (FIG. 4). The resistor region 18 and the superconductive layer 12 are substantially in the same plane. As such, the resistor structure is substantially planar in topology.

The superconductive layer 12 can be selected from the group consisting essentially of copper-oxide superconductors. Example of suitable materials for the superconductive layer 12 includes YBa2Cu3O7 (YBCO), BiSrCaCuO and TlBaCaCuO. The superconductive layer 12 can vary in thickness from about 500 Å to about 5000 Å depending on the resistivity required.

The planar dimensions of the interconnect region 16 can be defined as square dimensions. If one square dimension is desired, the width and the length of the interconnect region 16 is 1 to 1. If a $\frac{1}{10}$ square dimension is desired, then the width of the interconnect region 16 is $\frac{1}{10}$ the length of the interconnect region 16. The sheet resistance per square can range from about 0.1 ohm to about 100 ohm. The conductive metal thickness can range from 100 Å to about 5000 Å depending on the resistivity required.

FIG. 3 illustrates a cross section of an in-line resistor fabricated according to the above process. Patterning can include masking the superconductive layer 12 with a photo-resist layer 20 to pattern the interconnect region 16. The photo-resist layer 20 can then be removed as shown in FIG. 4. The photo-resist layer 20 can be removed by plasma etching or wet resist stripping. This creates a portion of the superconductive layer 12 as an interconnect region 16 that lies in the same plane as the adjacent portion of the superconductive layer 12. The interconnect layer 16 can now be converted to a resistor material region.

As stated earlier the step of converting can include electron beam and ion-beam treatment in addition to ion-implanting the interconnect region 16 to convert the interconnect region FIG. 3 16 to a resistor material region FIG. 4 18. The implanted superconductive interconnect region 16 has higher resistance value than the masked, and protected, non-implanted regions of the superconductive layer 12. The correct technique of ion-implanting requires the additional step of rapid thermal annealing of the resistor regions to activate the implanted ions. When conversion is accomplished using the alternative steps of electron-beam or ion-beam treatment annealing is optional.

Therefore, according to the present invention, instead of having the superconductive interconnect and resistor thin film layers formed separately, the entire resistor structure is fabricated on the same thin film superconductive layer.

Ion-implantation dopes that portion of the superconductive layer 12 (interconnect region 16) which is exposed by the photo-resist layer 20 and converts said region 16 to a resistive material. The implant energy depends on the thickness of the superconductive layer 12. For superconductive layer 12 with thickness ranging from about 100 Å to about 1 $\mu$m, the implant energy can range from about 10 KeV to 500 KeV, respectively.

The implant species may include silicon (to destroy the superconductivity of the film), and/or metal ions such as silver, tin, aluminum, gold, etc. (to control the desired resistivity). The thermal anneal or rapid thermal anneal (RTA) process can be used to activate the implanted ions as needed.

Figure 5:
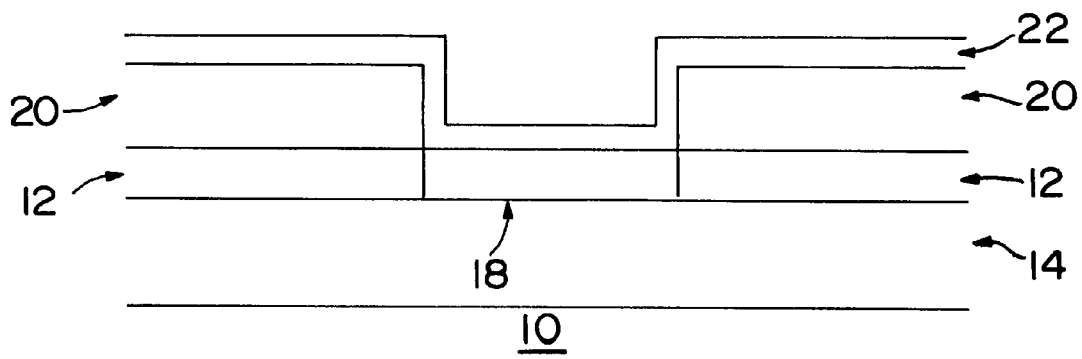
FIGS. 5–6 illustrate low value resistors fabricated according to the method of FIG. 2.
Figure 6:
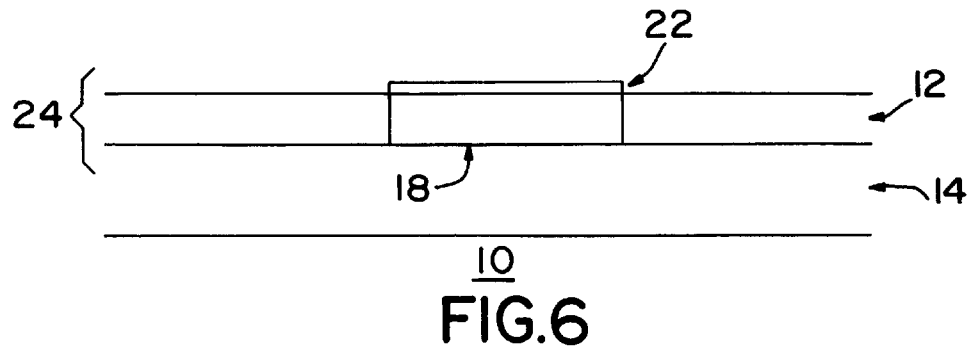

As shown in FIG. 5 and FIG. 6, the method of the present invention as shown in FIG. 2 can further include the steps of depositing a conductive layer 22 on the resistor region 18 and on the remaining photo-resist layer 20 of the in-line resistor of FIG. 3. Lifting off the remaining photo-resist layer 20 to leave the conductive layer 22 on the resistor region 18 as shown in FIG. 6. As such, the conductive layer 22 provides a low sheet resistivity for the resistor region 18. Accordingly the process permits the creation of a high value resistor or a low value resistor that is in-line with the superconductive layer.

The conductive layer 22 can be a noble metallic layer such as a thin metallic film of gold, silver or platinum. The conductive layer 22 can be deposited either before or after the implant process. A photo-resist liftoff process can be utilized to leave the metallic film 22 only on the defined resistor region 18 shown in FIG. 6. A resistor so fabricated can be used in applications where a low sheet resistivity for the resistor is required. In such applications, it is easier to achieve low sheet rho using the bi-layer structure 24 resistor of the present invention. The implanted superconductive interconnect region 18 has higher resistivity than the conductive metallic top layer 22, and current flowing through the resistor 10 will primarily be conducted by the lower resistance metallic top layer 22 of the bi-layer structure 24.

Because the structure of a resistor according to the present invention is planar, the resistor has low inductance.

Figure 1:
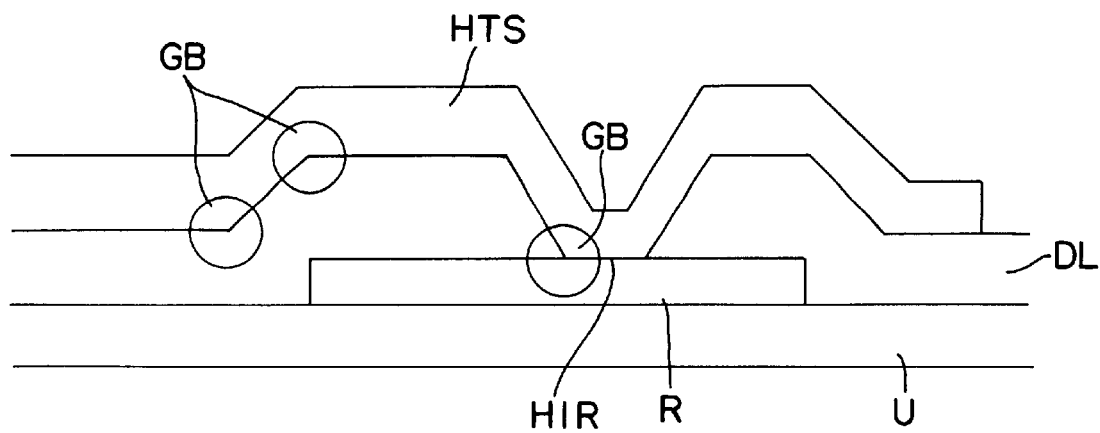
FIG. 1 is a schematic representation of the prior art resistor topology.

Comparing the prior art resistor of FIG. 1 to a resistor 10 according to the present invention in FIG. 6, the superconductive layer 12 contacts the resistor layer 20 directly. In FIG. 1, in order to make a contact with the resistor, it is necessary to drill two contact holes and have two superconductive contacts lie on top. As such, it is necessary to create access through several layers which introduces parasitic inductance. The planar resistor 10 of the present invention alleviates this problem.

Figure 8:
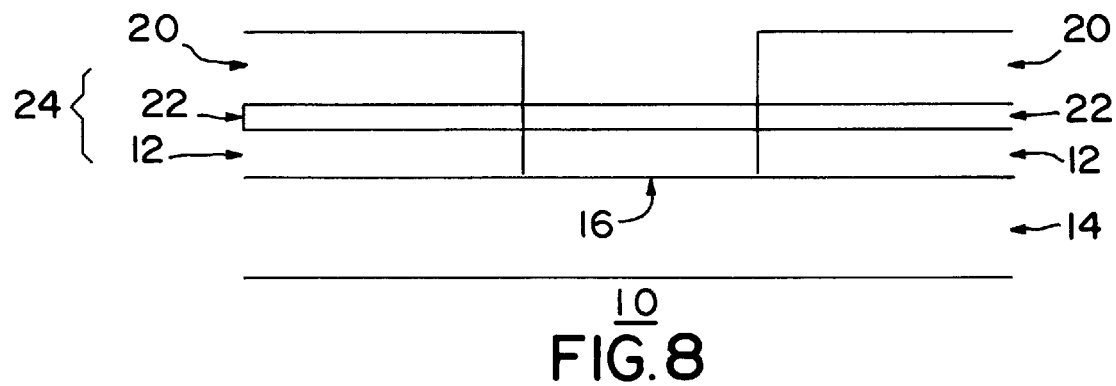
FIGS. 8–9 illustrate low value resistors fabricated according to the method of FIG. 7.
Figure 9:
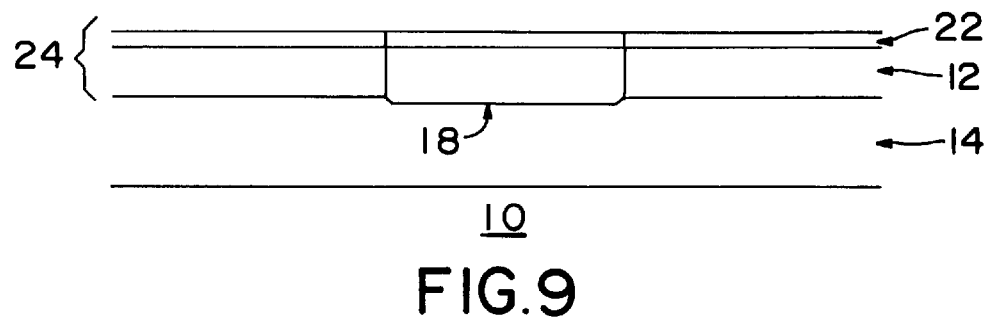
Figure 7:
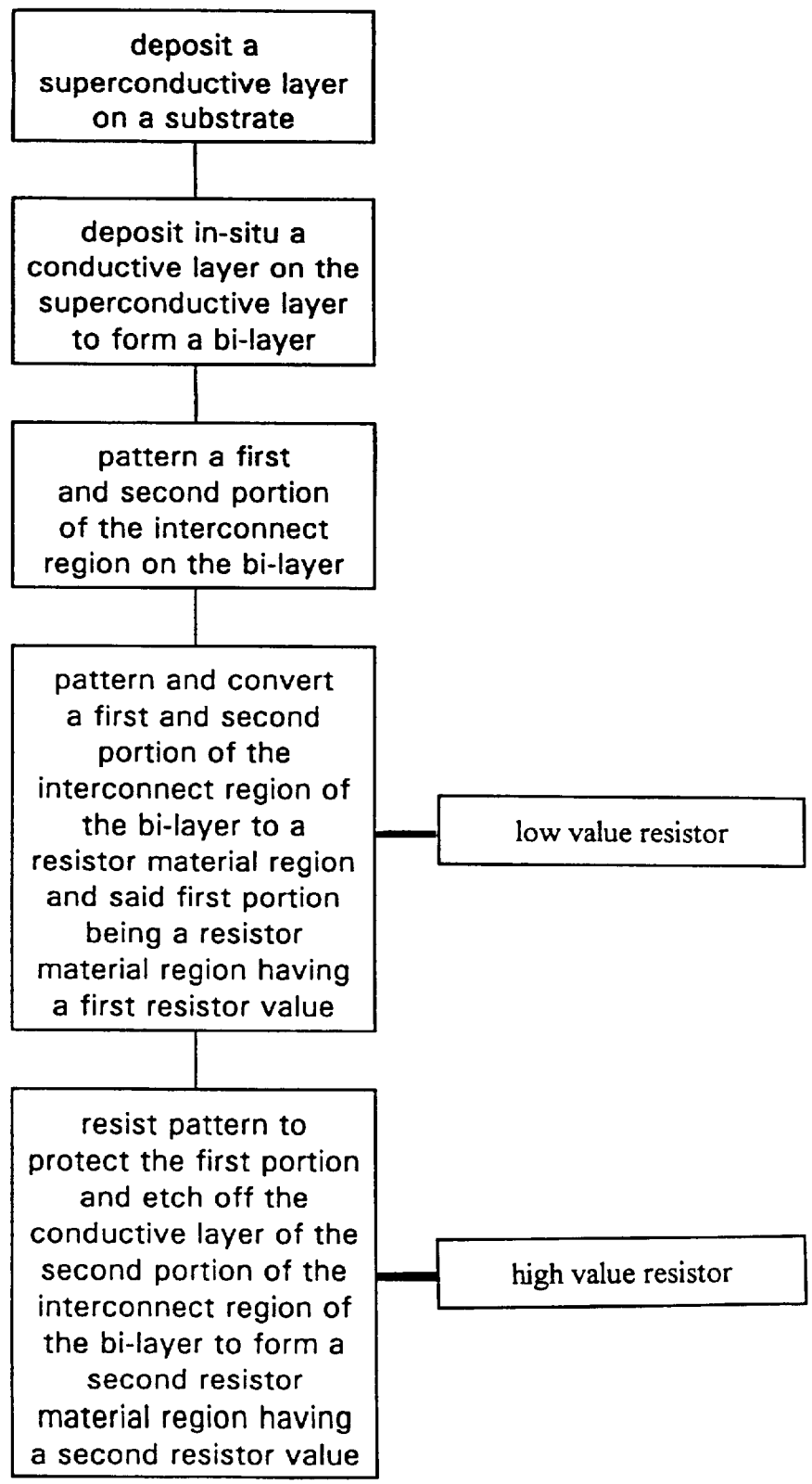
FIG. 7 illustrates the steps of another embodiment of a method of fabricating a low-inductance in-line high value and low value resistor according to the present invention.

Referring to FIGS. 7, 8 and 9, there is described the steps of another embodiment of a method of fabricating a low-inductance, in-line resistor array 10 on the same plane as the superconductive layer. According to the present invention the method includes the steps of: depositing in-situ a superconductive layer 12 on a base layer 14; depositing in-situ a conductive layer 22 on the superconductive layer 12 to form a bi-layer 24; patterning an interconnect region 16 on the bi-layer 24; and converting the interconnect region 16 of the bi-layer 24 to a low value resistor material region 18. Advantageously, the resistor region 18 and the bi-layer 24 are substantially in the same plane. Following the conversion step of the interconnect region of the bi-layer to a resistor material region a resist pattern is formed and by etching off the top metal region of the bi-layer forming a high value resistor. It will be understood that with the current process there can be created both a high value resistor and a low value resistor in the same plane.

As shown in FIG. 8, the alternative method deposits a bi-layer 24 in-situ by growing a superconducting thin film 12 on the base layer 14 followed by a thin metallic film of gold or silver 22. In contrast to the previously described methods of this invention the bi-layer technique can be accomplished in a continuous operation under vacuum without interruption. Advantageously, the in-situ deposition of the bi-layer 24 reduces potential contact interface resistance between the thin film superconductive layer 12 and the thin film metallic layer 22.

Creating the interconnect region 16 can be accomplished by masking the bi-layer 24 with a photo-resist layer 20 to the desired pattern as shown in FIG. 8 and then removing the photo-resist layer 20 (FIG. 9).

The interconnect region 16 is readily converted to a resistor region 18 by the technique of ion-implanting. The implanted superconductive interconnect region 18 has a higher resistivity than the metallic layer 22, and current flowing through the resistor will primarily be conducted by the lower resistance metallic top layer 22 of the bi-layer structure 24.

A resistor 10 fabricated according to the method of the present invention can advantageously be utilized in high temperature superconductor (HTS) integrated circuit (IC) processes. In HTS IC processes an HTS interconnect layer is fabricated by depositing a gold or silver and/or other metal film layer on the HTS layer. The process of the present invention is fully compatible with the HTS IC process because the top metallic gold or silver layer 22, serving as a resistor in the implanted resistor region 18, provides a low resistance interface for contacting the HTS layer (e.g. for contact pads and/or other normal metal interconnect layers built on top of the HTS interconnect layer). In places where the HTS bi-layer is superposed over an underlying layer there will result a ramp coverage discontinuity that can reduce the superconducting current capability of the HTS layer. As discussed earlier, herein growing the superconductive films over ramp discontinuities develops grain boundaries which reduces the supercurrent it carries due to electrical discontinuities. The metallic layer 22, however, serves as a very low resistance shunt across the discontinuity.

Advantageously, the process of the present invention is also fully compatible with superconductor-normal-superconductive (SNS) Josephson Junction processes. In SNS processes, the bi-layer structure 24 of the resistor 10 (FIGS. 6, 8 and 9) of the present invention can be used as the top counter electrode of the SNS junction. Another advantage of the bi-layer structure 24 is that the top metallic layer 22 can also serve as a passivation layer to a HTS layer which is susceptible to corrosion/degradation when exposed to room temperature conditions.

The resistor 10 of the present invention is low in inductance because of the simple planar structure of the resistor 10. The planar topology is very important when the resistor is used as a shunt/bias resistor for latching and Single-Flux-Quantum ("SFQ") SQUID devices where parasitic inductance strongly reduces device operation margin.

The planarized structure also reduces yield loss due to: (1) discontinuity of superconductive interconnect over contact steps, (2) high interconnect to resistor contact resistance, and (3) over-etch of thin resistor film in a conventional contact.

The in-situ bi-layer 24 resistor embodiments of the present invention provide the additional advantages of having a top metal layer 22 which: (1) provides a low resistance interface layer to contact a superconductor layer (e.g. HTS interconnect), (2) serves as a passivation layer to an HTS film against corrosion/degradation when exposed to room ambient, and (3) serves as a low resistance shunt of an HTS layer across discontinuity over steps.

In the different embodiments of the method of the present invention described above, the superconductive layer 12 can be also be a low temperature superconductor (LTS) layer. The base layer 14 can be a substrate or other materials such as superconductive layer or a dielectric layer, in a multi-layer process.

The present invention also contemplates having two or more in-line resistors on a superconductive layer 12. An example embodiment of such a topology utilizing the method of the present invention is shown FIG. 10. In this embodiment, two in-line resistors fabricated on the same superconductive layer 12 as shown. As shown in FIG. 11, by etching off the metallic layer 22 on one of the resistors, there is created a high value resistor, it is possible to have a low value in-line resistor and a high value in-line resistor on the same superconductive layer 12 are shown.

If the metallic layer 22 is not etched off, then the current will flow from the unimplanted superconductive layer 12 up to the metallic layer 22 then back down to the unimplanted superconductive layer 12, lowering the resistance of the resistor. Therefore, advantageously, this topology provides two different resistor values within one layer. The low value resistor can be from about 0.1 ohm to about 1 ohm per square. The high value resistor can be from about 50 ohm to about 100 ohm per square.

The present invention has been described in considerable detail with reference to certain preferred versions thereof; however, other versions are possible. Therefore, the spirit and scope of the appended claims should not be limited to the description of the preferred versions contained herein.

What is claimed is:

1. An array of in-line resistors having different resistance values comprising:

(a) a superconductive layer on a base layer;

(b) a conductive layer applied to the superconductive layer to form a bilayer;

(c) first and second interconnect regions including an interconnect layer on the bi-layer, said first and second interconnect regions comprising first and second resistor material regions in the same plane as the bi-layer;

(d) the first resistor material region converted with the interconnect layer removed so that it has a first resistor value; and (e) the second resistor material region having applied a conductive layer and converting the second resistor material region so that it has a second resistor value.

2. The resistor of claim 1 wherein the conductive layer is a metallic layer.

3. An in-line resistor for a superconductive circuit comprising:
   (a) a superconductive layer on a base layer;
   (b) an interconnect region comprising a conductive layer applied to selective portions of the superconductive layer, said conductive layer having a thickness in the range of 100 Å to 5000 Å said interconnect region comprising resistor material regions convertible to resistors in which the resistor value resulting from conversions depends on the thickness of the conductive layer.

4. The in-line resistors as claimed in claim 3 wherein the resistor values is less than 100 ohms.

5. An array of planar resistors having different resistor values comprising:
   (a) a superconductive layer on a base layers;
   (b) a conductive layer deposited on the superconductive layer forming a bi-layer;
   (c) first and second interconnect regions selectively formed on the conductive layer of the bi-layer;
   (d) first and second resistor material regions formed on the first and second interconnect regions, said first resistor material region comprising a resistor having a first resistor value;
   (e) a conductive layer selectively deposited on said second resistor material region, said second resistor in the second interconnect region having a second resistor value;
   whereby said planar array of resistors comprises a current path to the superconductive layer and the resistors through the interconnect regions.

6. The resistors of claim 5 wherein the first and second interconnect regions include resistor material regions adjacent the superconductive layer which are convertible to resistors.

7. The resistors of claim 6 wherein the resistor region is in the same plane as the superconducting layer.

8. The resistor of claim 5 wherein the conductive layer is a metallic layer.

9. An in-line resistor as claimed in claim 5 wherein the resistor has a reduced inductance.

10. An array of planar resistors having different resistor values for superconductor circuits comprising:
    (a) a superconductive layer on a substrate;
    (b) an interconnect region on the superconductive layer forming a bi-layer, said bi-layer including a first and second interconnect region comprising first and second resistor material regions formed by converting at least one said interconnect regions;
    (c) a conductive layer selectively deposited on the second resistor material region;
    (d) whereby said bi-layer comprises a first resistor having a first resistor value in the first resistor material region and a second resistor in the second resistor material region having a second resistor value wherein the superconductive circuits provide a current path through the interconnecting region that lies in the same plane as adjacent portions of the superconductive layer.

11. The array of resistors as claimed in 10 wherein the first resistor has a first value and the second resistor has a second value said second value being lower than said first value.

* * * * *